United States Patent

Adachi

(10) Patent No.: US 6,720,843 B2
(45) Date of Patent: Apr. 13, 2004

(54) FILTER SWITCHING CIRCUIT HAVING A SHORTER DISTANCE OF CONNECTION FOR A HIGHER FREQUENCY PASSBAND

(75) Inventor: Akihide Adachi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/131,922

(22) Filed: Apr. 25, 2002

(65) Prior Publication Data

US 2002/0159436 A1 Oct. 31, 2002

(30) Foreign Application Priority Data

Apr. 25, 2001 (JP) ......................................... 2001-127585

(51) Int. Cl.[7] .............................. H03H 11/04; H01P 1/10
(52) U.S. Cl. ........................ 333/173; 333/174; 333/101
(58) Field of Search ................................. 333/173, 174, 333/175, 101, 105, 176; 455/339; 330/306, 126

(56) References Cited

U.S. PATENT DOCUMENTS

| | | | | |
|---|---|---|---|---|
| 4,422,047 A | * | 12/1983 | Wright | .......................... 330/51 |
| 4,792,993 A | * | 12/1988 | Ma | ............................. 455/266 |
| 4,852,080 A | * | 7/1989 | Ohtake et al. | ............... 333/173 |

FOREIGN PATENT DOCUMENTS

| | | |
|---|---|---|
| JP | 11-243349 | 9/1999 |
| JP | 2000-502525 | 2/2000 |

* cited by examiner

Primary Examiner—Seungsook Ham
Assistant Examiner—Dean Takaoka
(74) Attorney, Agent, or Firm—Brinks Hofer Gilson & Lione

(57) ABSTRACT

A filter switching circuit includes first and second amplifiers, relays, and bandpass filters in which a bandpass filter having a higher frequency passband is selected by a smaller number of relays and the selected bandpass filter is connected in a decreased distance. A first relay is disposed near the input or output end of the first or second amplifier, respectively, and the other relays are positioned to correspond to the filters. The other relays are provided in opposite sides of a line connecting the output and input end, and the switching terminals of each pair of relays on the same side of the line are sequentially connected to one fixed terminal of each of the relays so that the other relays are sequentially connected to first and second fixed terminals of the first relay and each relay is connected to each second fixed terminal of each of the other relays.

2 Claims, 2 Drawing Sheets

FILTER SWITCHING CIRCUIT HAVING A SHORTER DISTANCE OF CONNECTION FOR A HIGHER FREQUENCY PASSBAND

BACKGROUND OF THE INVENTION

1. Field of the Invention

The present invention relates to a filter switching circuit for selecting one of a plurality of bandpass filters having different frequency bands that allow signals to pass through them.

2. Description of the Related Art

When using television signals on many channels arranged in a broad frequency band, a television signal transmitter divides the television signals into a plurality of smaller bands for transmission in order to prevent disturbance from occurring due to a beat signal between television signals on each channel, harmonics, etc. Accordingly, a plurality of bandpass filters for transmitting the signals in the smaller bands are provided, and one of the bandpass filters is selected.

FIG. 2 shows a conventional filter switching circuit that selects one of a plurality of bandpass filters and connects the selected one between two amplifiers. A printed circuit board 51 has a first amplifier 52 and a second amplifier 53 thereon, with a distance provided therebetween. The first amplifier 52 is formed in an almost rectangular area having a longitudinal dimension Y1 and a lateral dimension X1, and the second amplifier 53 is formed in an almost rectangular area having a longitudinal dimension Y2 and a lateral dimension X2. The output end 52a of the first amplifier 52 and the input end 53a of the second amplifier 53 are opposed to each other.

In an area between the first amplifier 52 and the second amplifier 53, on a side (the lower side in FIG. 2) to a straight line (not shown) connecting the output end 52a and the input end 53a, a plurality of bandpass filters (called a "bandpass filter 54-1" to a "bandpass filter 54-8" from the top) (hereinafter referred to also as "bandpass filters 54" for denoting the entirety of the bandpass filters 54-1 to 54-8) are provided in parallel so as to be almost perpendicular to the straight line and to have equal distances to the output end 52a and the input end 53a.

The bandpass filters 54 are designed so that eight bands obtained by dividing a frequency range (e.g., 50 MHz to 600 MHz) can pass through them. The bandpass filter 54-1 has the highest frequency passband (510 MHz to 600 MHz).

The bandpass filters 54-2 to the 54-7 have sequentially lower frequency passbands, and the bandpass filter 54-8 has the lowest frequency passband (50 MHz to 60 MHz).

Between the first amplifier 52 and the bandpass filters 54, a plurality of relays 55-1 to 55-7 (hereinafter referred to also as "relays 55" for denoting the entirety of the relays 55-1 to 55-7) respectively corresponding to the bandpass filters 54-1 to 54-7 are provided. Between the bandpass filters 54 and the second amplifier 53, a plurality of relays 56-1 to 56-7 (hereinafter referred to also "relays 56" for denoting the entirety of the relays 56-1 to 56-7) respectively corresponding to the bandpass filters 54-1 to 54-7 are provided.

The relays 55 and 56 consist of, for example, relays having identical structures. Each of the relays 55 and 56 includes a switching terminal a, two fixed terminals to which the switching terminal a selectively connects, that is, a first fixed terminal b and a second fixed terminal c.

Among the relays 55, only the switching terminal a of the relay 55-1 is connected in the smallest distance to the output end 52a. The other relays 55-2 to 55-7 are connected to the output end 52a in seven stages in cascade such that their switching terminals a are sequentially connected to their second fixed terminals c when these are connected to the output end 52a.

Similarly, among the relays 56, only the switching terminal a of the relay 56-1 is connected in the smallest distance to the input end 53a. The other relays 56-2 to 56-7 are connected to the input end 53a in seven stages in cascade such that their switching terminals a are sequentially connected to their second fixed terminals c when these are connected to the input end 53a.

The bandpass filter 54-1 having the highest frequency passband is connected between the first fixed terminals b of the relays 55-1 and 56-1, and the bandpass filter 54-2 having the second highest frequency passband is connected between the first fixed terminals b of the relays 55-2 and 56-2. Similarly, the bandpass filters 54-3 to 54-6, which have sequentially lower frequency passbands, are connected between the relays 55 and the relays 56. The bandpass filter 54-8 is connected between the second fixed terminals c of the relays 55-7 and 56-7.

The switching terminals a of pairs of corresponding relays, that is, a pair of the relays 55-1 and 56-1 to a pair of the relays 55-7 and 56-7 are switched in cooperation so as to be connected to their first fixed terminals b or their second fixed terminals c.

For example, the relay 55-1 and the corresponding relay 56-1 in the first stage are switched in cooperation, and the relay 55-2 and the corresponding relay 56-2 are switched in cooperation. Similarly, the other pairs of relays are switched.

In the above structure, a bandpass filter having a higher frequency passband is connected by a smaller number of relays to the output end 52a and the input end 53a in the smallest distance. Therefore, also in a case in which the frequency of a signal to be transmitted is high, signal loss and level deterioration are reduced. In addition, influence on characteristics of the relays 55 and 56, such as a cutoff frequency and transmission loss, are reduced.

"Nevertheless, in the above structure, the bandpass filter having a higher frequency passband is selected by a smaller number of relays. However, since the bandpass filters 54 and the relays 55 and 56 are provided on one side to the straight line connecting the output end 52a of the first amplifier 52 and the input end 53a of the second amplifier 53, a space B is formed on the other side between the first amplifier 52 and the second amplifier 53 is formed. Accordingly, the space-using efficiency of the printed circuit board 51 deteriorates, thus causing a problem in that the entire size of the printed circuit board 51 enlarges."

SUMMARY OF THE INVENTION

It is an object of the present invention to provide a switching circuit that selects a bandpass filter having a higher frequency passband by using a smaller number of relays and connects between two amplifiers in a distance as shortest as possible.

To this end, according to an aspect of the present invention, the above object is achieved through provision of a filter switching circuit including a first amplifier formed on a printed circuit board, a second amplifier formed on the printed circuit board separately from the first amplifier, the second amplifier having an input end opposed to the output end of the first amplifier, a plurality of filters having different frequency passbands, and a plurality of relays each having two fixed terminals and a switching terminal for connecting to one of the fixed terminals, the relays connecting one of the filters between the output end and the input end. The filters and the relays are arranged in parallel in columns in an area between the first amplifier and the second amplifier on the printed circuit board so as to cross a straight line connecting the output end and the input end so that one relay among the relays is positioned almost on the straight line while the switching terminal of the one relay is connected to the output end or the input end, and the other relays are connected in cascade to one fixed terminal of the one relay by connecting each switching terminal thereof to either fixed terminal while connecting each of the filters to the other fixed terminal, whereby the frequency passbands of filters having closer connections to the one relay are sequentially higher increased.

According to another aspect of the present invention, the above object is achieved through provision of a filter switching circuit including a first amplifier formed on a printed circuit board, a second amplifier formed on said printed circuit board separately from said first amplifier, said second amplifier having an input end opposed to the output end of said first amplifier, a plurality of filters having different frequency passbands, and first and second groups of relays each having two fixed terminals and a switching terminal for connecting to one of the fixed terminals, the groups of relays being each formed by a plurality of relays for connecting one of said plurality of relays between the output end and the input end. The relays of the first and second groups and the filters are arranged in parallel in an area between said first amplifier and said second amplifier on said printed circuit board so as to cross a straight line connecting the output end and the input end so that the filters are positioned between the first group of relays and the second group of relays, and one relay in the first group of relays and one relay in the second group of relays are arranged almost on said straight line while the switching terminals thereof are separately connected to the output end and the input end so that the other relays in each group of relays are connected in cascade to one fixed terminal of said one relay in each group of relays by connecting each switching terminal thereof to either fixed terminal, and between the other fixed terminals of two corresponding relays among the other relays in the groups of relays, each of the filters is connected, whereby the frequency passbands of filters having closer connections to the said one relay are sequentially higher increased.

As described above, filters and relays are arranged in parallel in columns in an area between a first amplifier and a second amplifier on a printed circuit board so as to cross a straight line connecting the output end of the first amplifier and the input end of the second amplifier so that one relay among the relays is positioned almost on a straight line connecting the output end and the input end while the switching terminal of the one relay is connected to the output end or the input end, and the other relays are connected in cascade to one fixed terminal of the one relay by connecting each switching terminal thereof to either fixed terminal while connecting each of the filters to the other fixed terminal, whereby the frequency passbands of filters having closer connections to the one relay are sequentially higher increased. Thus, a filter having a higher frequency playback is selected by a smaller number of relays to be connected between the output end and the input end in the smallest distance, and a space on the printed circuit board can be effectively used.

In addition, relays of first and second groups and filters are arranged in parallel in an area between a first amplifier and a second amplifier on a printed circuit board so as to cross a straight line connecting the output end of the first amplifier and the input end of the second amplifier so that the filters are positioned between the first group of relays and the second group of relays, and one relay in the first group of relays and one relay in the second group of relays are arranged almost on the straight line while the switching terminals thereof are separately connected to the output end and the input end so that the other relays in each group of relays are connected in cascade to one fixed terminal of the one relay in each group of relays by connecting each switching terminal thereof to either fixed terminal, and between the other fixed terminals of two corresponding relays among the other relays in the groups of relays, each of the filters is connected, whereby the frequency passbands of filters having closer connections to the one relay are sequentially higher increased. Thus, the selected filter is separated from the other relays, and the characteristics of the filters do not deteriorate.

DESCRIPTION OF THE PREFERRED EMBODIMENT

Figure 1:
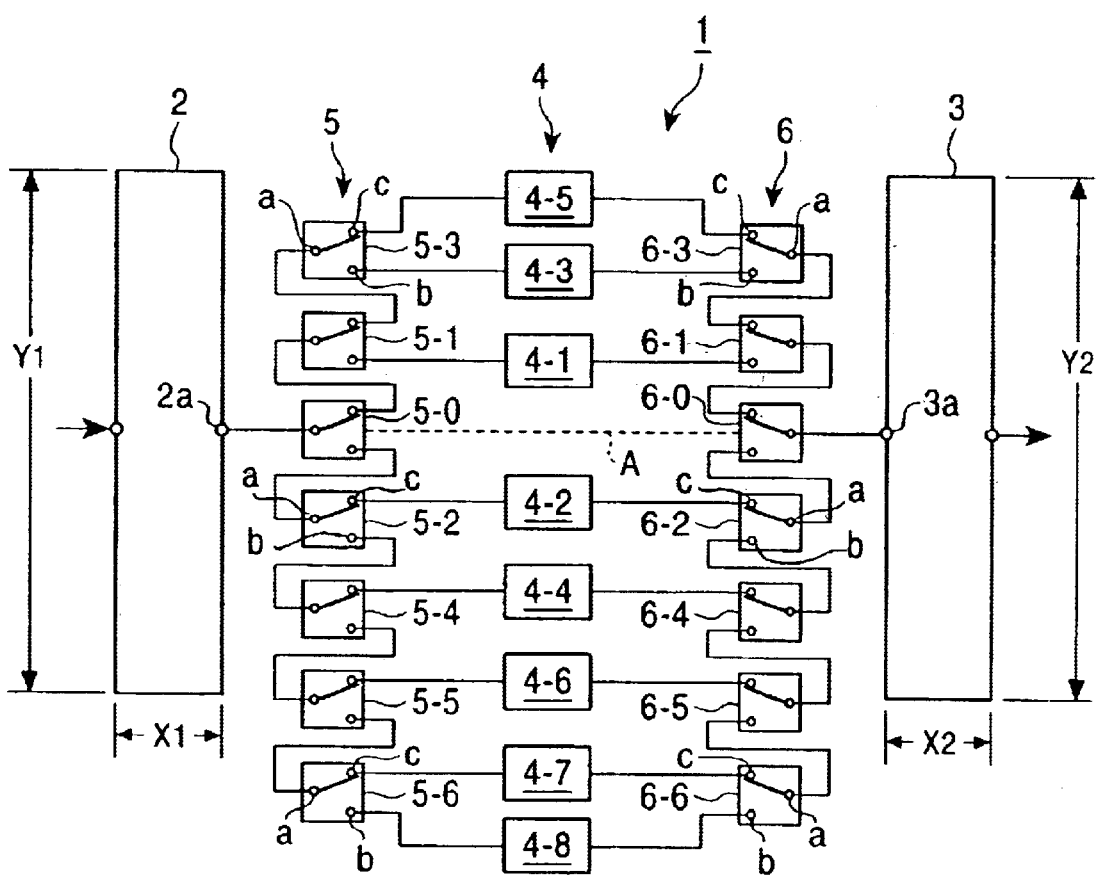
FIG. 1 is a circuit diagram showing a filter switching circuit of the present invention.
Figure 2:
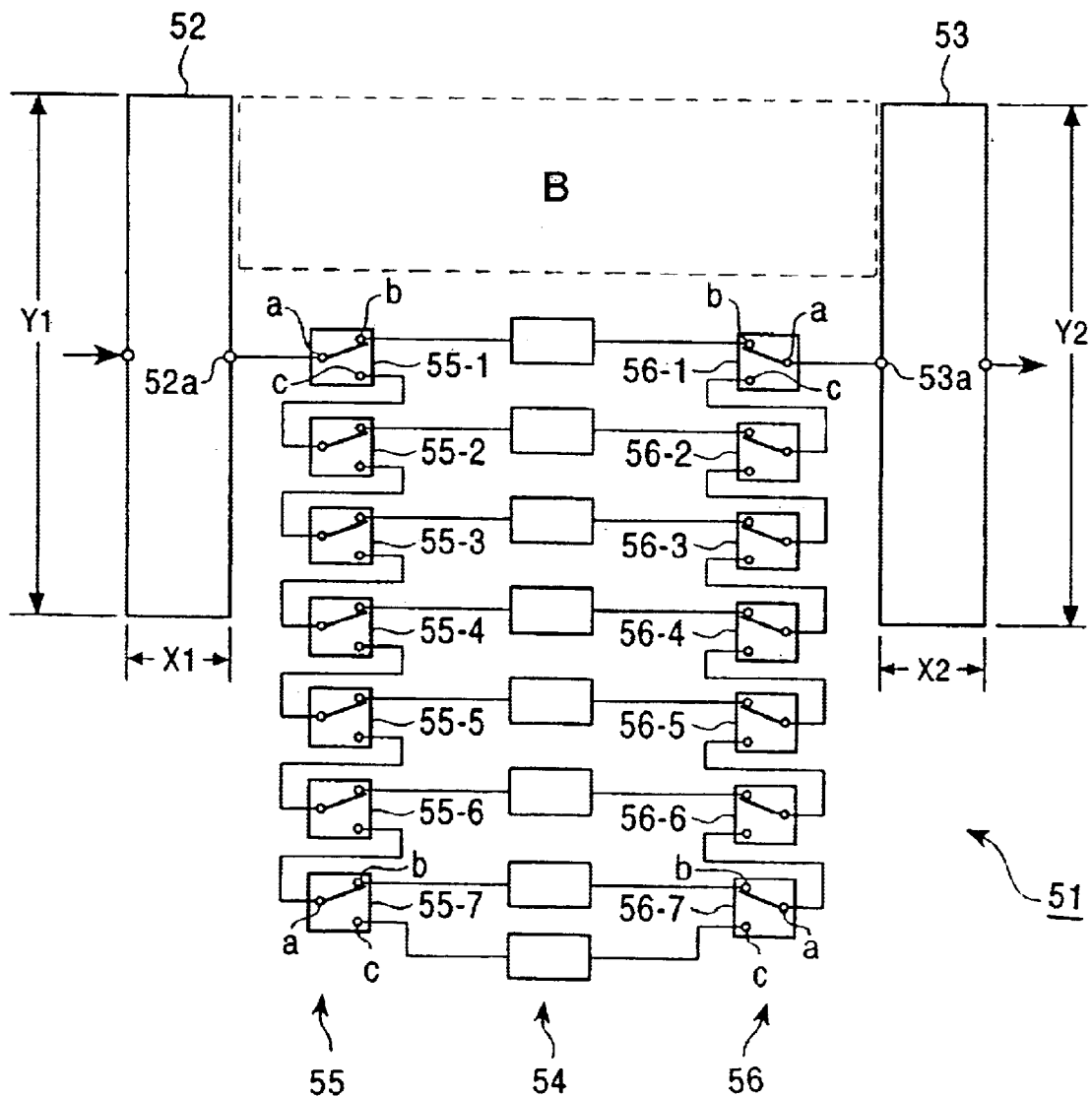
FIG. 2 is a circuit diagram showing a conventional filter switching circuit.

FIG. 1 shows a filter switching circuit 1 of the present invention. The filter switching circuit 1 has a first amplifier 2 and a second amplifier 3 on a printed circuit board, with a distance provided therebetween. The first amplifier 2 is formed in an almost rectangular area having a longitudinal dimension Y1 and a lateral dimension X1. The second amplifier 3 is formed in an almost rectangular area having a longitudinal dimension Y2 and a lateral dimension X2. The output end 2a of the first amplifier 2 and the input end 3a of the second amplifier 3 are opposed to each other almost in the centers of the longitudinal dimensions Y1 and Y2 of the areas.

In an area between the first amplifier 2 and the second amplifier 3, on two sides to a straight line (the broken straight line A shown in FIG. 1) connecting the output end 2a and the input end 3a, a plurality of filters, for example, bandpass filters 4-1 to 4-8 (hereinafter referred to also as "bandpass filter 4" for denoting the entirety of the bandpass filters 4-1 to 4-8) are provided in parallel so as to be almost perpendicular to the straight line A and to have equal distances to the output end 2a and the input end 3a.

The bandpass filter 4-1 having the highest frequency passband, and the bandpass filter 4-2 having the next highest frequency passband are symmetrically provided on the opposite sides in the vicinity of the straight line A. Similarly, bandpass filters having sequentially lower frequency passbands are somewhat symmetrically provided, having greater distances from the straight line A. Specifically, two further pairs of bandpass filters 4-3, 4-4 and 4-5, 4-6 with the next highest frequency passbands are provided symmetrically, with the bandpass filters 4-3 and 4-5 provided on one side (the upper side in FIG. 1) to the straight line A, and the bandpass filters 4-4, 4-6, 4-7, and 4-8 provided on the other side (the lower side in FIG. 1) to the straight line A. The bandpass filters 4-7, 4-8 with the two lowest frequency passbands are provided on the lower side of the straight line A and are thus not symmetric with respect to the straight line A. However, the effect of decreasing the transmission line length is minimal for signals passing through these bandpass filters as the attenuation of signals traveling along the transmission lines decreases with decreasing frequency. Of course, the bandpass filters may be disposed completely symmetrically to minimize the space used on the circuit board between the amplifiers 52, 53. The bandpass filters 4 are provided in the form of a column, crossing the straight line A.

Between the first amplifier 2 and the bandpass filters 4, first relays 5 (respectively referred to also as "relays 5-0 to 5-6") formed by a plurality of relays are provided as a group perpendicularly to the straight line A so as to almost correspond to the bandpass filters 4. Among the relays 5, only the first relay 5-0 is positioned in the vicinity of the output end 2a almost on the straight line A. The relays 5-1 and 5-3 are positioned on the upper side to the straight line A, and the relays 5-2, 5-4, 5-5, and 5-6 are positioned on the other side to the straight line A.

Between the bandpass filters 4 and the second amplifier 3, second relays 6 (respectively referred to also as "relays 6-0 to 6-6") formed by a plurality of relays are provided as a group perpendicularly to the straight line A so as to almost correspond to the bandpass filters 4. Among the relays 6, only the second relay 6-0 is positioned in the vicinity of the input end 3a almost on the straight line A. The relays 6-1 and 6-3 are positioned on the upper side to the straight line A, and the relays 6-2, 6-4, 6-5, and 6-6 are positioned on the lower side to the straight line A.

The first relays 5 and the second relays 6 are arranged in columns, crossing the straight line A.

The first relays 5 and the second relays 6 are formed by, for example, relays having identical structures. Each of the relays has a switching terminal a, and two fixed terminals to which the switching terminal a selectively connects, that is, a first fixed terminal b and a second fixed terminal c.

"Among the first relays 5, only the switching terminal a of the first relay 5-0 is connected to the output end 2a, and among the other relays 5-1 to 5-6, the switching terminal a of the relay 5-1 is connected to the second fixed terminal c of the relay 5-0 which is connected to the output end 2a. The switching terminal a of the relay 5-3 is connected to the second fixed terminal c of the relay 5-1.

Among the relays 5-1 to 5-6, the switching terminal a of the relay 5-2 is connected to the first fixed terminal b of the relay 5-0. Similarly, the switching terminals a of the relays 5-4, 5-5, and 5-6 are respectively connected in cascade to the first fixed terminals b of adjacent relays.

Similarly, among the second relays 6, only the switching terminal a of the first relay 6-0 is connected to the output end 2a, and among the other relays 6-1 to 6-6, the switching of terminal a of the relay 6-1 is connected to the second terminal c of the relay 6-0 which is connected to the output end 2a. The switching terminal c of the relay 6-3 is connected to the second fixed terminal c of the relay 6-1.

Also, among the relays 6-1 to 6-6, the switching terminal a of the relay 6-2 is connected to the first fixed terminal b of the relay 6-0. Similarly,the switching terminals a of the relays 6-4, 6-5 are respectively connected in cascade to the first fixed terminals b of adjacent relays."

Accordingly, in the upper side to the straight line A, three stages of relays are connected in cascade, including the relays 5-0 and 6-0 on the straight line A, and in the lower side to the straight line A, five stages of relays are connected in cascade, including the relays 5-0 and 6-0 on the straight line A.

The bandpass filter 4-1 having the highest frequency passband is connected between the first fixed terminals b of the first relay 5-1 and the second relay 6-1, and the bandpass filter 4-2 having the second highest frequency passband is connected between the first fixed terminals b of the first relay 5-2 and the second relay 6-2. Similarly, the bandpass filter 4-3 having the third highest frequency passband is connected between the first fixed terminals b of the first relay 5-3 and the second relay 6-3. The bandpass filter 4-4 having the fourth highest frequency passband is connected between the first fixed terminals b of the first relay 5-4 and the second relay 6-4. The bandpass filter 4-5 having the fifth highest frequency passband is connected between the second fixed terminals c of the first relay 5-3 and the second relay 6-3. The bandpass filter 4-6 having the sixth highest frequency passband is connected between the first fixed terminals b of the first relay 5-5 and the second relay 6-5. The bandpass filters 4-7 and 4-8 have the lowest frequency passband. The bandpass filter 4-7 is connected between the first fixed terminals b of the first relay 5-6 and the second relay 6-6, and the bandpass filter 4-8 is connected between the second fixed terminals c of the first relay 5-6 and the second relay 6-6.

The switching terminals a of pairs of corresponding relays, that is, a pair of the relays 5-0 and 6-0 to a pair of the relays 5-6 and 6-6 are switched in cooperation so as to be connected to their first fixed terminals b or their second fixed terminals c.

For example, the first relay 5-0 and the corresponding second relay 6-0 in the first stage are switched in cooperation, and the first relay 5-1 and the corresponding second relay 6-1 in the second stage are switched in cooperation. Similarly, the other pairs of relays are switched.

In the above structure, the bandpass filters 4 and the first and second relays 5 and 6 are provided on the opposite sides to the straight line A connecting the output end 2a of the first amplifier 2 and the input end 3a of the second amplifier 3, and bandpass filters having higher frequency passbands are selected by a smaller number of relays so as to be connected to the output end 2a and the input end 3a in each smallest distance. Accordingly, a space on the printed circuit board 1 can be effectively used, and a loss in signal transmitted between the amplifiers 2 and 3 can be reduced, thus reducing changes in the characteristics of the bandpass filters 4.

Also by deleting the first relays 5 or the second relays 6 and by either directly connecting the input ends of the bandpass filters 4 to the output end 2a of the first amplifier 2 or directly connecting the output ends of the bandpass filters 4 to the input end 3a of the second amplifier 3, one the bandpass filters 4 can be selected.

It is claimed:

1. A filter switching circuit comprising:
   a first amplifier formed on a printed circuit board;
   a second amplifier formed on said printed circuit board separately from said first amplifier, said second amplifier having an input end opposed to an output end of said first amplifier;
   a plurality of filters having different frequency passbands; and
   a plurality of relays each having two fixed terminals and a switching terminal to connect to one of the fixed terminals, the relays to connect one of the filters between the output end and the input end;
   wherein the filters and the relays are arranged in parallel in columns in an area between said first amplifier and said second amplifier on said printed circuit board so as to cross a straight line connecting the output end and the input end so that one relay among the relays is positioned almost on said straight line while the switching terminal of said one relay is connected to one of the output end and the input end, and the other relays are disposed on either side of said straight line, and the switching terminal of each of the disposed relays is connected to a closer fixed terminal of the two fixed terminals of a relay adjacent to said each of the disposed relays while connecting each of the plurality of filters to the other fixed terminal of said adjacent relay, whereby on either side of the straight line the frequency passbands of filters having closer connections to the said one relay are sequentially higher increased.

2. A filter switching circuit comprising:

a first amplifier formed on a printed circuit board;

a second amplifier formed on said printed circuit board separately from said first amplifier, said second amplifier having an input end opposed to an output end of said first amplifier;

a plurality of filters having different frequency passbands; and first and second groups of relays each having two fixed terminals and a switching terminal to connect to one of the fixed terminals, the groups of relays being each formed by a plurality of relays to connect one of said plurality of relays between the output end and the input end;

wherein the relays of the first and second groups and the filters are arranged in parallel in an area between said first amplifier and said second amplifier on said printed circuit board so as to cross a straight line connecting the output end and the input end so that the filters are positioned between the first group of relays and the second group of relays, and one relay in the first group of relays and one relay in the second group of relays are arranged almost on said straight line, and the other relays in each of the first and second groups are disposed on either side of said straight line so that the switching terminal of each of the disposed relays is connected to a closer fixed terminal of the two fixed terminals of a relay adjacent to said each of the disposed relays, and each of the filters is connected to the other fixed terminal of each of two of the disposed relays corresponding aligned between the first and second amplifiers, whereby on either side of the straight line the frequency passbands of filters having closer connections to the said one relay in the first and second group of relays are sequentially higher increased.

* * * * *